United States Patent
Hsu

[11] Patent Number: 5,902,123
[45] Date of Patent: May 11, 1999

[54] METHOD OF FABRICATING A STACKED CAPACITOR OF A DYNAMIC RANDOM ACCESS MEMORY

[75] Inventor: Chen-Chung Hsu, Taichung, Taiwan

[73] Assignee: United Microelectronics Corp., Taiwan

[21] Appl. No.: 08/953,239

[22] Filed: Oct. 17, 1997

[30] Foreign Application Priority Data

Jan. 24, 1997 [TW] Taiwan ................... 86100813

[51] Int. Cl.$^6$ ............................... H01L 21/8242
[52] U.S. Cl. ................. 438/253; 438/254; 438/649
[58] Field of Search ................. 438/250–256, 438/396–398, 649

[56] References Cited

U.S. PATENT DOCUMENTS 5,286,668  2/1994  Chou .
5,416,037  5/1995  Sato et al. .
5,478,769  12/1995  Lim .

*Primary Examiner*—Jey Tsai
*Attorney, Agent, or Firm*—Finnegan, Henderson, Farabow, Garrett & Dunner, L.L.P.

[57] ABSTRACT

A method of forming a stacked capacitor of a DRAM. A number of doped polysilicon layers and a number of tungsten silicide layers are alternately formed. The doped polysilicon layers and the tungsten silicide layers are then patterned to form a lower electrode of the stacked capacitor. The doped polysilicon layers and the tungsten silicide layers are selectively etched to form a number of lateral trenches at the sidewall of the lower electrode so that the surface area of the lower electrode is increased. A dielectric layer is formed over the exposed surface of the doped polysilicon layers and the tungsten silicide layers. A conductive layer is formed on the dielectric layer as an upper electrode of the stacked capacitor so that the stacked capacitor is completed.

5 Claims, 2 Drawing Sheets

METHOD OF FABRICATING A STACKED CAPACITOR OF A DYNAMIC RANDOM ACCESS MEMORY

BACKGROUND OF THE INVENTION

1. Field of the Invention

The invention relates in general to the fabrication of semiconductor integrated circuits (ICs), and more particularly to a method of fabricating a stacked capacitor of a dynamic random access memory (DRAM).

2. Description of the Related Art

DRAM is a kind of widely used ICs. The data in a DRAM are saved by charging or discharging. Therefore, the charge saved in the capacitor of the DRAM must be in an operation range to make sure of that the data can be correctly read and written. Because of the trend of higher integrity ICs, the size of the DRAM is gradually reduced and simultaneously, the size of the capacitor is cut down. However, for a storage capacitor of a fixed operation voltage, as the distance of the electrodes and the dielectric constant of the dielectric layer are fixed, the amount of saved charge then depends on the area of capacitor plate. The charge saved in a capacitor is undesirably reduced as the area occupied by the DRAM capacitor is shrunk.

FIG. 1A to FIG. 1D shows a method of fabricating a capacitor of a DRAM. As shown in FIG. 1A, a silicon substrate 10 is firstly provided, wherein a metal-oxide-semiconductor (MOS) 11 and a field oxide 12 are already formed. The MOS 11 and the field oxide 12 are covered by an insulating layer 15 and a contact window 20 is formed on a source/drain region 16 of the MOS device 11.

Next, a first polysilicon layer 21 is deposited over the substrate 10. The first polysilicon layer 21 is then doped and annealed to increase its conductivity. Next, the first polysilicon layer 21 is patterned to form a lower electrode of a capacitor, as shown in FIG. 1B. A dielectric layer 26 is then deposited over the lower electrode of the capacitor, the first polysilicon layer 21, as shown in FIG. 1C. A second polysilicon layer 28 having a thickness of about 1000 Å to 2000 Å is deposited on the surface of the dielectric layer 26 and then doped by, for example, $POCl_3$, to increase its conductivity. Therefore, the upper electrode 28 of the capacitor is formed and the capacitor structure is completed, as shown in FIG. 1D.

With the requirement of high integrity device, the capacitor fabricated by the above-mentioned process fails in being correctly read and written.

Consequently, it is an object of the invention to provide a method of fabricating a stacked capacitor of a DRAM, which uses a number of doped polysilicon and tungsten silicide layers to form the lower electrode of the capacitor. The doped polysilicon layers and the tungsten suicide layers are selectively etched to form a number of lateral trenches at the sidewall of the stacked structure to increase the surface area of the electrode and also the capacitance. By this way, the capacitance of the lateral trench stacked capacitor can be risen to about 1.5 times of the conventional capacitor without the complicate process steps as forming the conventional stacked capacitor. Moreover, the amount of capacitance can be controlled by the number of the polysilicon layers and the tungsten silicide layers.

SUMMARY OF THE INVENTION

It is therefore an object of the invention to provide a process for forming a stacked capacitor of a DRAM. A number of doped polysilicon layers and a number of tungsten silicide layers are alternately formed. The doped polysilicon layers and the tungsten silicide layers are then patterned to form a lower electrode of the stacked capacitor. The doped polysilicon layers and the tungsten silicide layers are selectively etched to form a number of lateral trenches at the sidewall of the lower electrode so that the surface area of the lower electrode is increased. A dielectric layer is formed over the exposed surface of the doped polysilicon layers and the tungsten silicide layers. A conductive layer is formed on the dielectric layer as an upper electrode of the stacked capacitor so that the stacked capacitor is completed.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIGS. 2A to 2D shows the process steps of fabricating a stacked capacitor of a DRAM according to the preferred embodiment of the invention. The characteristic of the invention is to alternately form a number of the doped polysilicon layers and tungsten silicide layers and selectively etch these layers, using the character of different etching rates so that the surface area of the electrode is then increased and the capacitance consequently rises. Also, the process steps are simplified by a single selective etching.

Figure 1A:
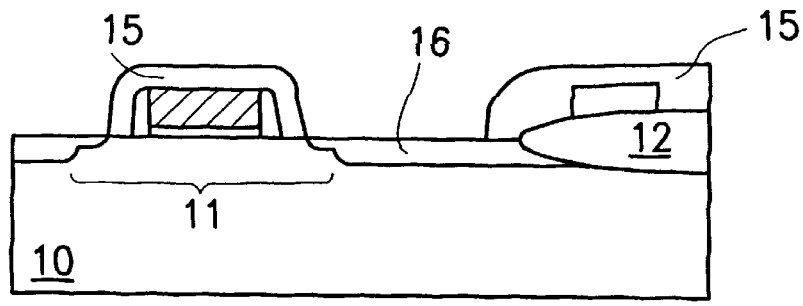
FIGS. 1A to 1D are cross-sectional views showing the process steps of fabricating a conventional DRAM capacitor.
Figure 1B:
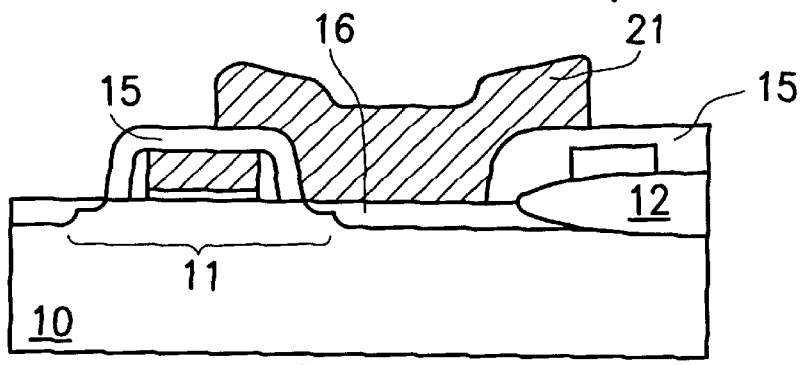
Figure 1C:
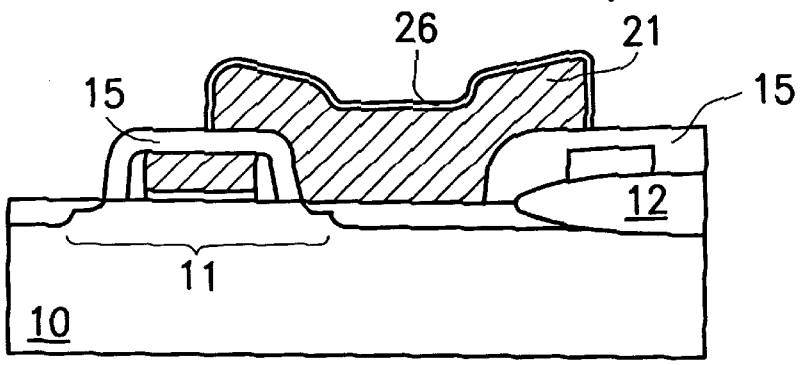
Figure 1D:
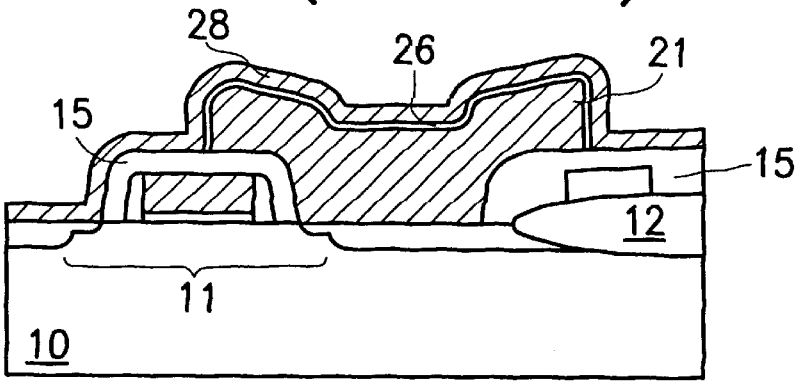
Figure 2A:
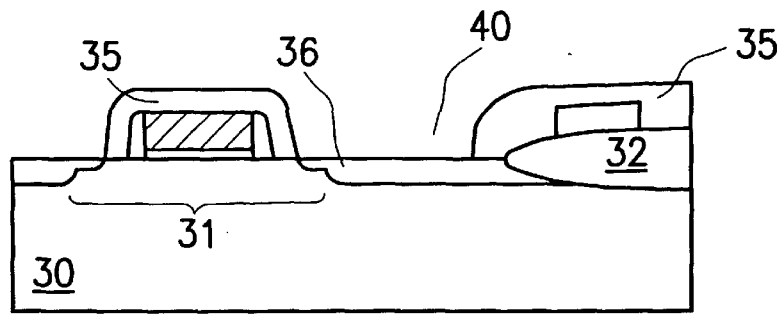
FIGS. 2A to 2D are cross-sectional views showing the process steps of fabricating a stacked capacitor of a DRAM according to one preferred embodiment of the invention.

Firstly, a silicon substrate 30 is provided wherein a MOS device 31 and a field oxide layer 32 are formed on it. An insulating layer 35 is formed to cover the MOS device 31 and the field oxide layer 32. As shown in FIG. 2A, a contact window 40 is formed over the source/drain region 36.

Figure 2B:
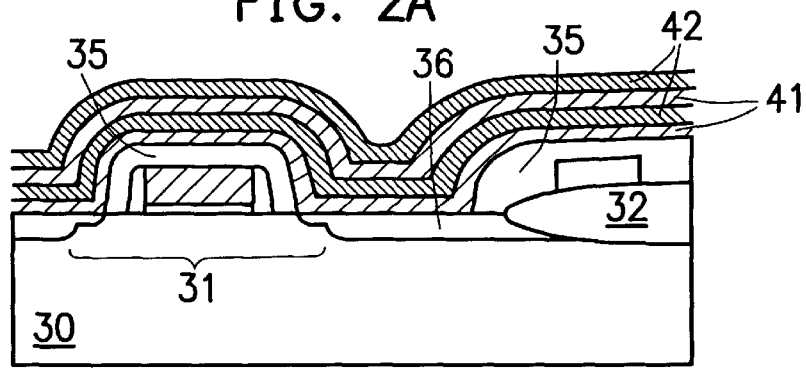
Figure 2C:
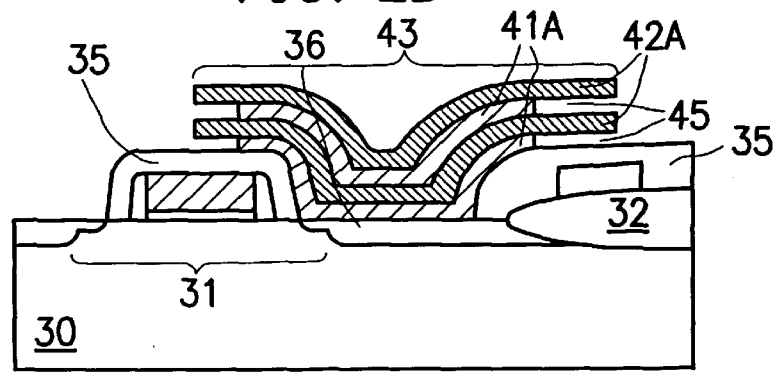

Next, referring to FIG. 2B, a number of doped polysilicon layers 41 and tungsten silicide layers 42 are alternately deposited on the silicon substrate to form a stacked structure. After that, an annealing process is performed.

Next, the stacked structure of a number of doped polysilicon layers 41 and tungsten silicide layers 42 is patterned to form a lower electrode 43 of a capacitor. Then, a wet etching process is performed to selectively etch the doped polysilicon layers 41A and tungsten silicide layers 42A so that a number of lateral trenches 45 are formed inbetween the tungsten suicide layers 42A. Consequently, the surface area of the lower electrode is increased shown in FIG. 2C.

Figure 2D:
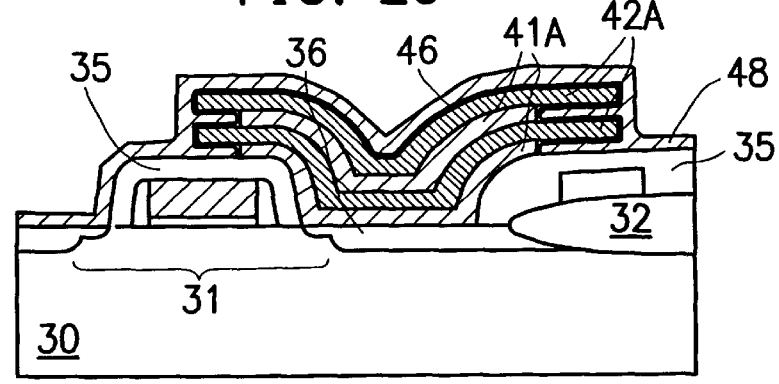

Then, a dielectric layer 46 is deposited over the lower electrode 43 including the doped polysilicon layer 41A and tungsten silicide layer 42A. A conductive layer 48, such as a metal layer or a polysilicon layer, is then deposited on the dielectric layer 46 to form an upper electrode of the capacitor, as shown in FIG. 2D.

To form the above-mentioned dielectric layer 46, a silicon nitride layer can be firstly deposited on the surface of the lower electrode 43 and then a thin oxide layer is grown over the silicon nitride layer. This nitride/oxide layer is sometimes formed on an oxide layer, such as a native oxide layer, to form a oxide/nitride/oxide dielectric layer. Also, tantalum pentoxide or other thin film of high dielectric coefficient can serve as the dielectric layer.

Due to the stacked structure of doped polysilicon layer and the tungsten silicide layer is selectively etched, a number of lateral trenches are formed at the sidewall. As a result, the surface area of the electrode plate is increased and a fin structure of a stacked capacitor is formed. The stacked capacitor according to the invention has a capacitance 1.5 times bigger than that of a conventional DRAM but without complicated process as to form the conventional stacked capacitor. Only single selective etching process is required and the amount of capacitance can be controlled by the number of the doped polysilicon layer and the tungsten silicide. Thus, a great advance is approached in the aspect of capacitance increase and the process simplification.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a stacked capacitor of a dynamic random access memory, comprising the steps of:

providing a silicon substrate having a field oxide layer, a metal-oxide-semiconductor device, and an insulating layer with a contact window formed thereon;

alternately forming each of a plurality of doped polysilicon layers and each of a plurality of tungsten silicide layers;

performing an annealing process on the silicon substrate subsequent to forming the plurality of doped polysilicon layers and the plurality of tungsten silicon layers;

patterning the plurality of doped polysilicon layers and the plurality of tungsten silicide layers to form a lower electrode of the stacked capacitor;

selectively etching the plurality of doped polysilicon layers and the plurality of tungsten silicide layers to form a plurality of lateral trenches at a sidewall of the lower electrode to increase a surface area of the lower electrode;

forming a dielectric layer over an exposed surface of the plurality of doped polysilicon layers and the plurality of tungsten silicide layers; and forming a conductive layer on the dielectric layer to form an upper electrode of the stacked capacitor.

2. A method as claimed in claim 1, wherein after the step of forming the doped polysilicon layers and the tungsten silicide layers, a annealing process is performed.

3. A method as claimed in claim 1, wherein the selectively etching process is a wet etching process.

4. A method as claimed in claim 1, wherein the dielectric layer is an oxide/nitride/oxide layer.

5. A method as claimed in claim 1, wherein the dielectric layer is a tantalum pentoxide layer.

* * * * *